United States Patent
Huang et al.

(10) Patent No.: US 8,765,588 B2
(45) Date of Patent: Jul. 1, 2014

(54) SEMICONDUCTOR PROCESS

(75) Inventors: Pong-Wey Huang, Tainan (TW);
Chan-Lon Yang, Taipei (TW);
Chang-Hung Kung, Kaohsiung (TW);
Wei-Hsin Liu, Changhua County (TW);
Ya-Hsueh Hsieh, Kaohsiung (TW);
Bor-Shyang Liao, Kaohsiung (TW);
Teng-Chun Hsuan, Tainan (TW);
Chun-Yao Yang, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 139 days.

(21) Appl. No.: 13/248,011

(22) Filed: Sep. 28, 2011

(65) Prior Publication Data

US 2013/0078792 A1    Mar. 28, 2013

(51) Int. Cl.
*H01L 21/3205* (2006.01)
*H01L 21/4763* (2006.01)

(52) U.S. Cl.
USPC ............................ 438/591; 438/199; 257/369

(58) Field of Classification Search
USPC .................. 438/199, 240, 591, 785; 257/369, 257/E21.19
See application file for complete search history.

(56) References Cited

U.S. PATENT DOCUMENTS

| | | |
|---|---|---|
| 6,033,963 A | 3/2000 | Huang |
| 6,653,698 B2 | 11/2003 | Lee |
| 6,858,483 B2 | 2/2005 | Doczy |
| 6,921,711 B2 | 7/2005 | Cabral, Jr. |
| 6,953,719 B2 | 10/2005 | Doczy |
| 6,967,131 B2 | 11/2005 | Saenger |
| 6,972,225 B2 | 12/2005 | Doczy |
| 7,029,966 B2 | 4/2006 | Amos |
| 7,056,794 B2 | 6/2006 | Ku |
| 7,064,050 B2 | 6/2006 | Cabral, Jr. |
| 7,064,066 B1 | 6/2006 | Metz |
| 7,074,680 B2 | 7/2006 | Doczy |
| 7,084,025 B2 * | 8/2006 | Phua et al. ............... 438/199 |
| 7,112,851 B2 | 9/2006 | Saenger |
| 7,126,199 B2 | 10/2006 | Doczy |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,160,767 B2 * | 1/2007 | Brask et al. ............... 438/195 |
| 7,183,184 B2 | 2/2007 | Doczy |
| 7,220,635 B2 | 5/2007 | Brask |
| 7,316,949 B2 | 1/2008 | Doczy |

(Continued)

OTHER PUBLICATIONS

Chen, "Characterization and temperature controlling property of TiAlN coatings deposited by reactive magnetron co-sputtering", Journal of Alloys and Compounds 472 (2009) 91-96, Jun. 12, 2008.

*Primary Examiner* — Phuc Dang
(74) *Attorney, Agent, or Firm* — Winston Hsu; Scott Margo

(57) ABSTRACT

A semiconductor process includes the following steps. An interdielectric layer is formed on a substrate and the interdielectric layer has a first recess and a second recess. A metal layer is formed to cover the surface of the interdielectric layer, the first recess and the second recess. Partially fills a sacrificed material into the first recess and the second recess so that a portion of the metal layer in each of the recesses is respectively covered. The uncovered metal layer in each of the recesses is removed. The sacrificed material is removed. An etching process is performed to remove the remaining metal layer in the first recess and reserve the remaining metal layer in the second recess.

20 Claims, 10 Drawing Sheets

(56) References Cited

U.S. PATENT DOCUMENTS

| | | |
|---|---|---|
| 7,317,231 B2 | 1/2008 | Metz |
| 7,326,610 B2 | 2/2008 | Amos |
| 7,355,281 B2 | 4/2008 | Brask |
| 7,390,709 B2 | 6/2008 | Doczy |
| 8,507,342 B2 * | 8/2013 | Hong .......................... 438/243 |
| 2003/0129805 A1 * | 7/2003 | Kim ........................... 438/386 |
| 2005/0064690 A1 | 3/2005 | Amos |
| 2006/0071285 A1 * | 4/2006 | Datta et al. .................. 257/407 |
| 2007/0262451 A1 | 11/2007 | Rachmady |
| 2009/0039433 A1 | 2/2009 | Yang |
| 2009/0057769 A1 | 3/2009 | Wei |
| 2009/0186458 A1 | 7/2009 | Yu |
| 2009/0275179 A1 | 11/2009 | Basker |
| 2010/0052066 A1 | 3/2010 | Yu |
| 2010/0065926 A1 | 3/2010 | Yeh |
| 2010/0068877 A1 | 3/2010 | Yeh |
| 2011/0120626 A1 * | 5/2011 | Lai ............................. 156/150 |
| 2011/0241166 A1 * | 10/2011 | Chumakov .................. 257/532 |
| 2012/0052641 A1 * | 3/2012 | Lee et al. .................... 438/270 |
| 2012/0244669 A1 | 9/2012 | Liao |
| 2012/0306026 A1 * | 12/2012 | Guo et al. ................... 257/407 |
| 2012/0313178 A1 | 12/2012 | Liao |
| 2013/0075827 A1 * | 3/2013 | Lee et al. .................... 257/369 |

* cited by examiner

SEMICONDUCTOR PROCESS

BACKGROUND OF THE INVENTION

1. Field of the Invention

The present invention relates generally to a semiconductor process, and more specifically, to a semiconductor process in which only one photomask is used to form layers of different depths, such as metal layers, in two recesses.

2. Description of the Prior Art

In a complementary metal-oxide semiconductor (CMOS) device, a dual work function metal gate is used for both an NMOS device and a PMOS device. Integration and process controls for the dual work function metal gate are more complicated, while thickness and composition controls for materials used when fabricating the dual work function metal gate are more precise. Fabrication of the conventional dual work function metal gate can be categorized into gate first processes and gate last processes. In a conventional gate first process for fabricating a dual work function metal gate, both an annealing process for forming a source/drain ultra-shallow junction and a silicide process are performed after forming the metal gate. After performing the annealing process with a strict heat budget, a flat band voltage ($V_{fb}$) does not increase or decrease linearly with decreasing EOT of a high-K gate dielectric layer; instead, roll-off is observed. The gate last process is developed to improve the $V_{fb}$ roll-off issue, prevent leakage current generation due to re-crystallization of the high-K gate dielectric layer during high-temperature processes, and widen material choices for the high-K gate dielectric layer and the metal gate in the gate first process.

In the conventional gate last process, a sacrificed gate or a replacement gate is provided, followed by performing processes used to construct a normal MOS transistor. Then, the sacrificed/replacement gate is removed to form a gate recess. Metals are filled into the gate recess depending upon electrical needs. For example, a work function metal layer, a barrier layer and a main electrode layer are sequentially filled and formed in the gate recess.

In a current CMOS transistor process, if a work function metal layer of a PMOS transistor is formed and then a work function metal layer of an NMOS transistor is formed, a work function metal layer of a PMOS transistor cover the recesses of the PMOS transistor and the NMOS transistor. Then, two photomasks are used to remove the work function metal layer in the recess of the NMOS transistor. However, using two photomasks is complicated and costly.

SUMMARY OF THE INVENTION

The present invention provides a semiconductor process, which can improve the complicated process of the two photomasks.

The present invention provides a semiconductor process including the following steps. An interdielectric layer is formed on a substrate, and the interdielectric layer has a first recess and a second recess. A metal layer is formed to cover the surface of the interdielectric layer, the first recess and the second recess. Partially fills a sacrificed material in the first recess and the second recess to respectively cover a portion of the metal layer in each of the recesses. The uncovered metal layer is removed in each of the recesses. The sacrificed material is removed. An etching process is performed to remove the remaining metal layer in the first recess and reserve the remaining metal layer in the second recess.

The present invention provides a semiconductor process including the following steps. An interdielectric layer is formed on a substrate and the interdielectric layer has a first recess and a second recess. A metal layer is formed to cover the surface of the interdielectric layer, the first recess and the second recess. Partially fills a sacrificed material in the first recess and the second recess to respectively cover a portion of the metal layer in each of the recesses. An etching process is performed to remove the sacrificed material in the first recess. The uncovered metal layer in the first recess, the second recess and on the interdielectric layer is removed. The remaining sacrificed material is removed in the second recess while the remaining metal layer is reserved in the second recess.

The present invention provides a semiconductor process, which entirely removes a metal layer in a recess while reserves a desired metal layer in the other recess by merely performing one time of a photolithography process; in other words, just using one photomask. Therefore, the present invention can simplify the complicated process of the prior art. Besides, due to the present invention does not using two photomasks, the scoring would not happen at the junction of the two photomasks, that leads to the material of the gate metal filling into the scoring and causing short circuit.

These and other objectives of the present invention will no doubt become obvious to those of ordinary skill in the art after reading the following detailed description of the preferred embodiment that is illustrated in the various figures and drawings.

DETAILED DESCRIPTION

A CMOS transistor is used as an example in the two following embodiments, but the semiconductor process of the present invention can be also applied to other semiconductor components that are not described herein.

Figure 1:
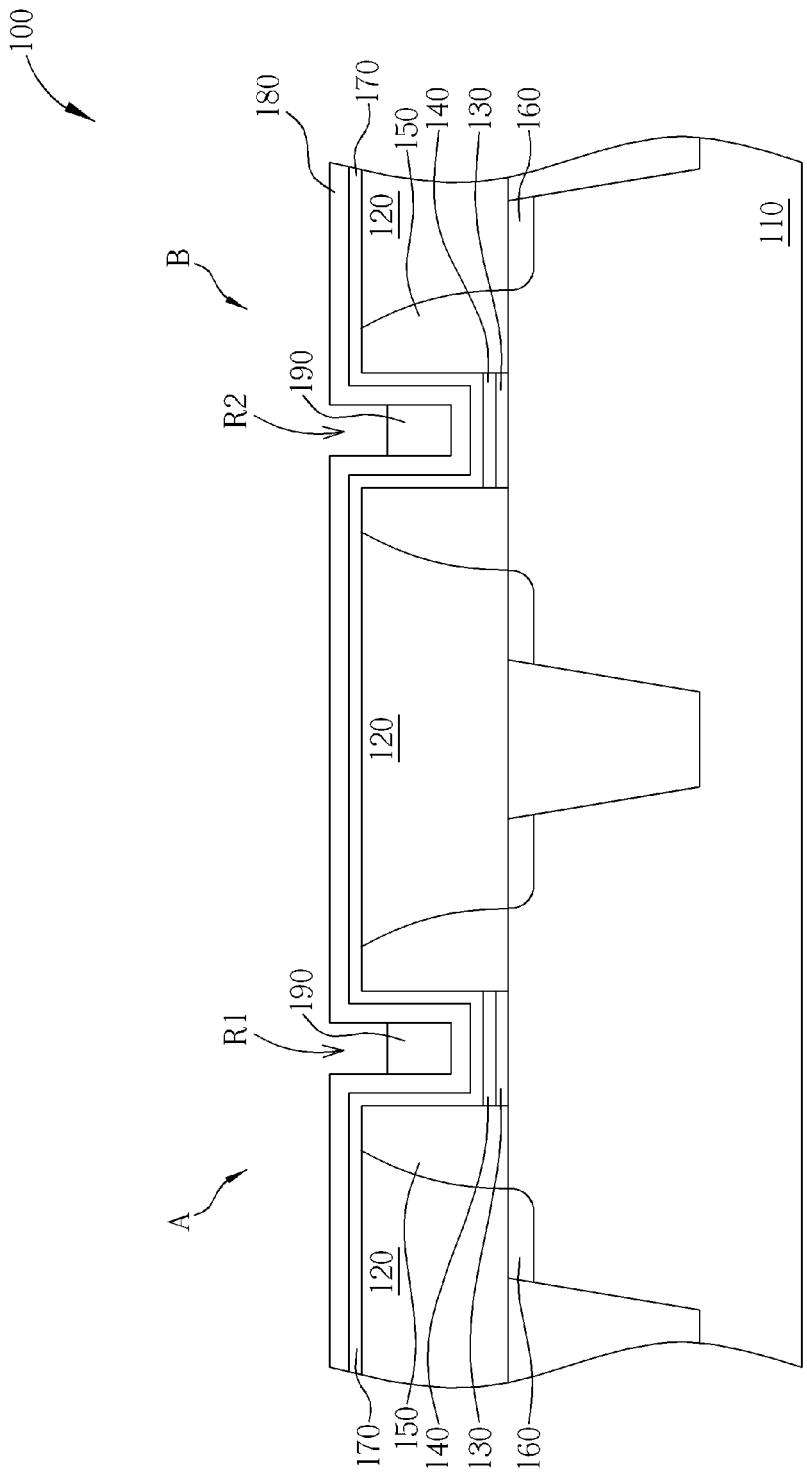
FIGS. 1-6 schematically depict a cross-sectional view of a semiconductor process according to the first preferred embodiment of the present invention.

A gate-last for high-k first process is performed in the following example. FIGS. 1-6 schematically depict a cross-sectional view of a semiconductor process according to the first preferred embodiment of the present invention. As shown in FIG. 1, a substrate 110 is provided. A desired sacrificed gate (not shown) is formed, which may include an interlayer 130 being formed, a gate dielectric layer 140 being formed, a gate material layer (not shown) being formed and a cap layer (not shown) being formed, then the cap layer, the gate material layer, the gate dielectric layer 140, and the interlayer 130 being patterned to form the sacrificed gate. Then, a spacer 150 is formed, and a source/drain region 160 is formed beside the spacer 150 in the substrate 110. An interdielectric layer 120 is formed on the substrate 110 covering the sacrificed gate. The gate dielectric layer 140 may be a dielectric layer having a high dielectric constant, and the material of the gate dielectric layer 140 may be selected from the group comprising hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate (PbZr$_x$Ti$_{1-x}$O$_3$, PZT) and barium strontium titanate (Ba$_x$Sr$_{1-x}$TiO$_3$, BST). Due to performing the gate-last for high-k first process, the gate dielectric layer 140 has a "-"-shaped profile structure.

After the interdielectric layer 120 is planarized, the gate material layer of each of the sacrificed layers (not shown) is removed to form a first recess R1 and a second recess R2 in the interdielectric layer 120. In this embodiment, a barrier layer (not shown) may be selectively formed on the gate dielectric layer 140 for protecting the gate dielectric layer 140 from being damaged by etching while the gate material layer of each of the sacrificed layers (not shown) is removed.

A barrier layer 170 may be selectively formed on the gate dielectric layer 140. The barrier layer 170 may be a single-layer or a multi-layers structure composed of tantalum nitride (TaN) or titanium nitride (TiN) etc. A metal layer 180 is formed to entirely cover the surface of the interdielectric layer 120, the first recess R1 and the second recess R2. The metal layer 180 may be a work function metal layer, which may be a single-layer or a multi-layers structure composed of metals having a desired work function value for a transistor such as tantalum nitride (TaN), titanium carbide (TiC), tantalum carbide (TaC), tungsten carbide (WC), titanium aluminide (TiAl), aluminum titanium nitride (TiAlN) or titanium nitride (TiN) etc. The work function metal layer may be a titanium nitride metal layer suited to forming a PMOS transistor (its work function value is between the range of 4.8 eV and 5.2 eV). The work function metal layer may also be an aluminum titanium metal layer suited to forming an NMOS transistor (its work function value is between the range of 3.9 eV and 4.3 eV). Furthermore, work function metal layers suitable for NMOS transistor A and PMOS transistor B are both needed to form a CMOS transistor 100. In this embodiment, a function metal layer paired with the PMOS transistor B is first filled into the first recess R1 of the NMOS transistor A and the second recess R2 of the PMOS transistor B, and the function metal layer filled into the first recess R1 is removed. Then, a work function metal layer paired with the NMOS transistor A is filled. The steps of the process may be rearranged.

In another realization of the first embodiment, by performing the gate-last for high-k last process, for example, the gate material layer (not shown) and the gate dielectric layer 140 are removed first for forming the first recess R1 and the second recess R2 in the interdielectric layer 120. Then, a dielectric layer having a high dielectric constant (not shown) is refilled into the first recess R1 and the second recess R2. In this process, because the gate dielectric layer 140 is removed, the material of the gate dielectric layer 140 can be selected from a wide range of materials, without restriction to the aforementioned material of the dielectric layer having a high dielectric constant. The dielectric layer having a high dielectric constant filled subsequently thereafter (not shown) has a U-shaped profile structure. A barrier layer may be selectively formed after the dielectric layer having a high dielectric constant is formed for use as an etching protective layer of the dielectric layer having a high dielectric constant, and then a metal layer may be formed thereon.

As shown in FIG. 1, after the first recess R1 and the second recess R2 are formed, a sacrificed material 190 is partially filled into the first recess R1 and the second recess R2 to cover the metal layer 180 in the lower portion of the first recess R1 and the second recess R2, so that the metal layer 180 in the upper portion of the first recess R1 and the second recess R2 is exposed. In more detail, the sacrificed material 190 may be formed entirely on the interdielectric layer 120 and filled into the first recess R1 and the second recess R2. An etching back process is performed to remove a portion of the sacrificed material 190 on the interdielectric layer 120 and in the first recess R1 and the second recess R2. The method of removing the portion of the sacrificed material 190 may be performing a dry etching process, performing a wet etching process, or performing a plasma bombardment process. In this embodiment, the sacrificed material 190 may be a material suited for filling gaps, which may be photoresist material, dielectric anti-reflection coating (DARC), light absorbing oxide (DUO), bottom anti-reflective coating (BARC), sacrificial light absorbing material (SLAM) or spin-on glass (SOG) etc, and the sacrificed material 190 may be formed by spin coating.

Figure 2:
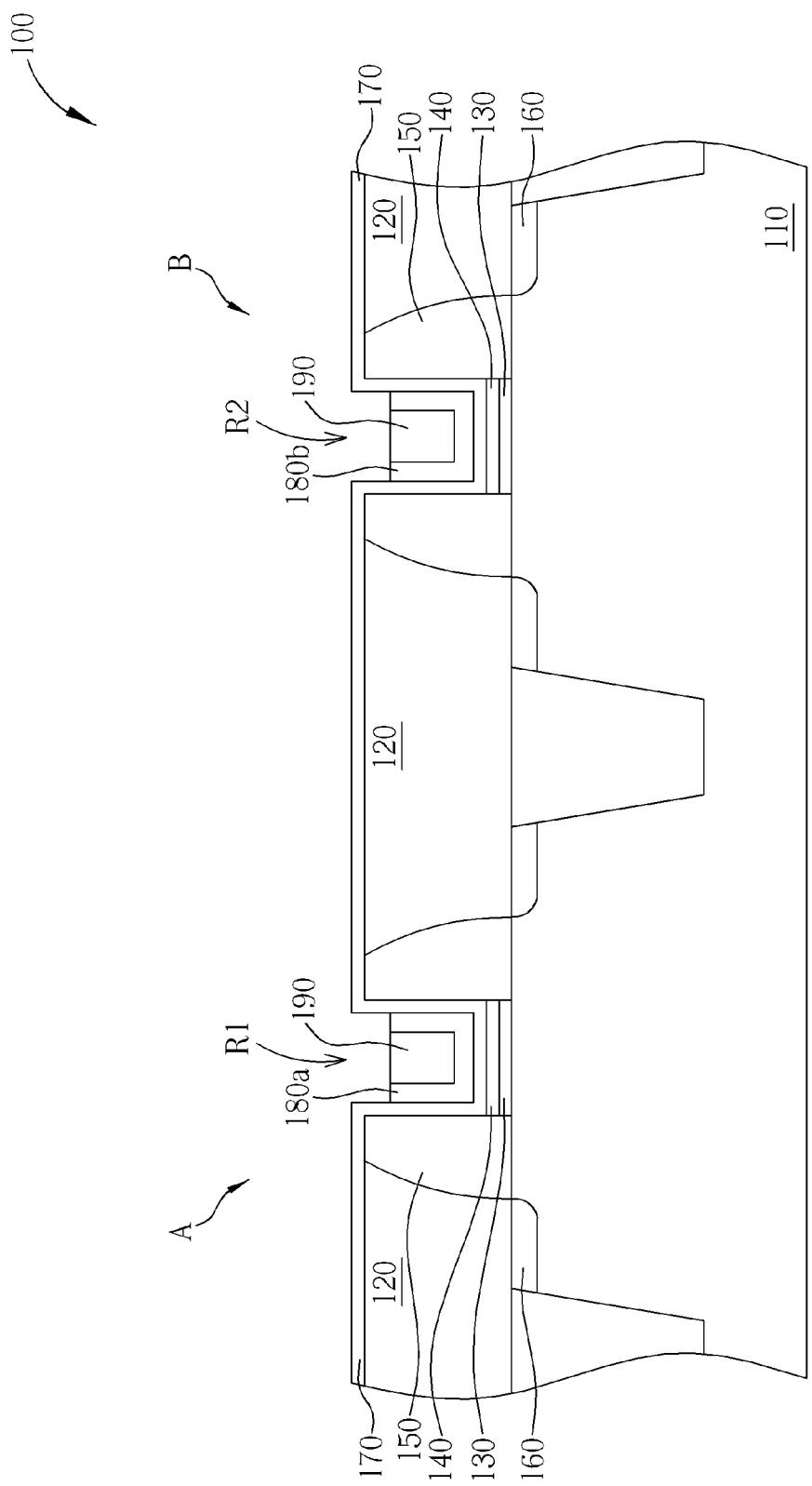
Figure 3:
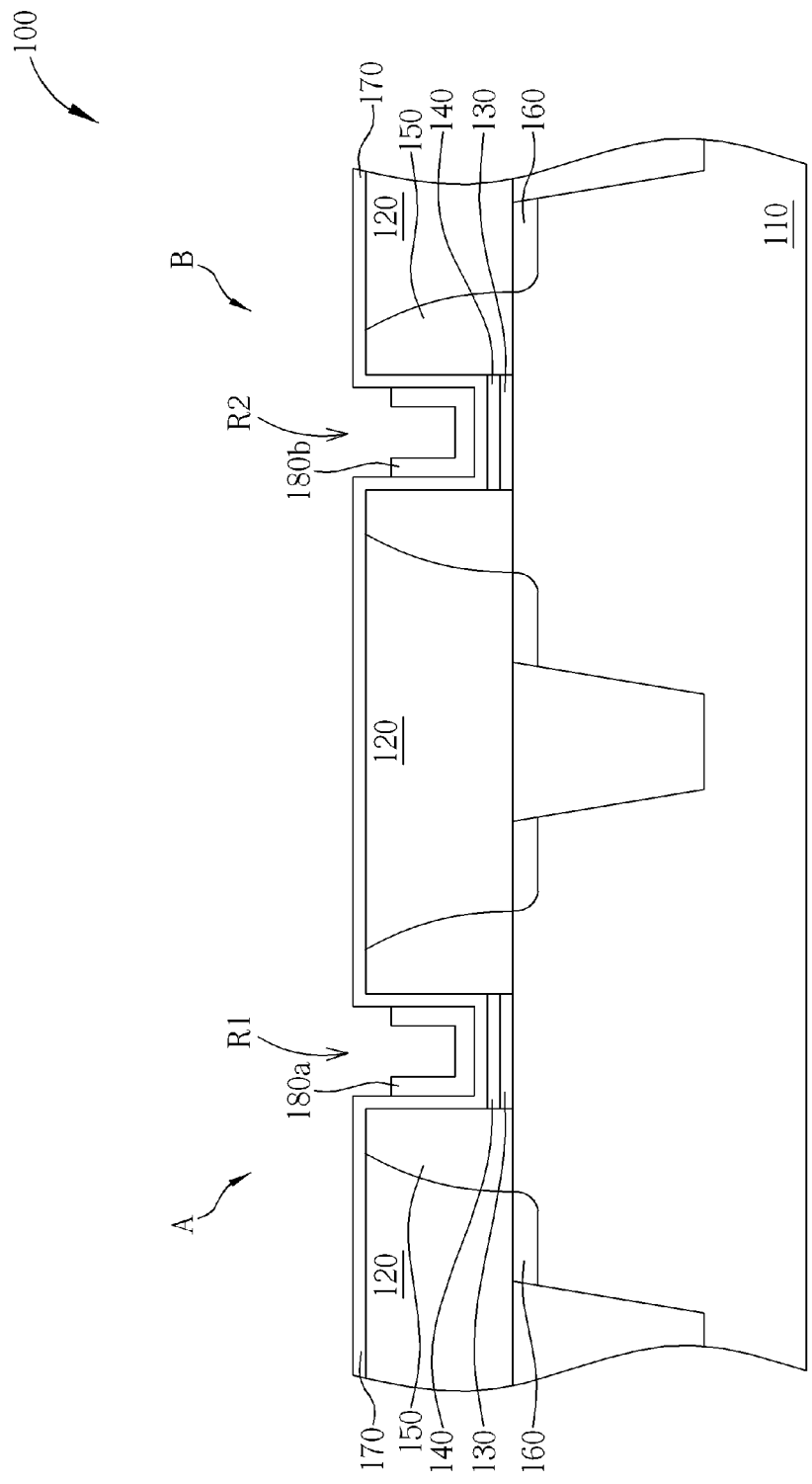

As shown in FIG. 2, an etching back process is performed to remove the uncovered metal layer 180 in the first recess R1 and the second recess R2. Therefore, the metal layer 180a in the lower portion of the first recess R1 and the metal layer 180b in the lower portion of the second recess R2 remain. As shown in FIG. 3, the sacrificed material 190 is removed. So, the metal layer 180a in the bottom of the first recess R1 and the metal layer 180b in the bottom of the second recess R2 are exposed.

Figure 4:
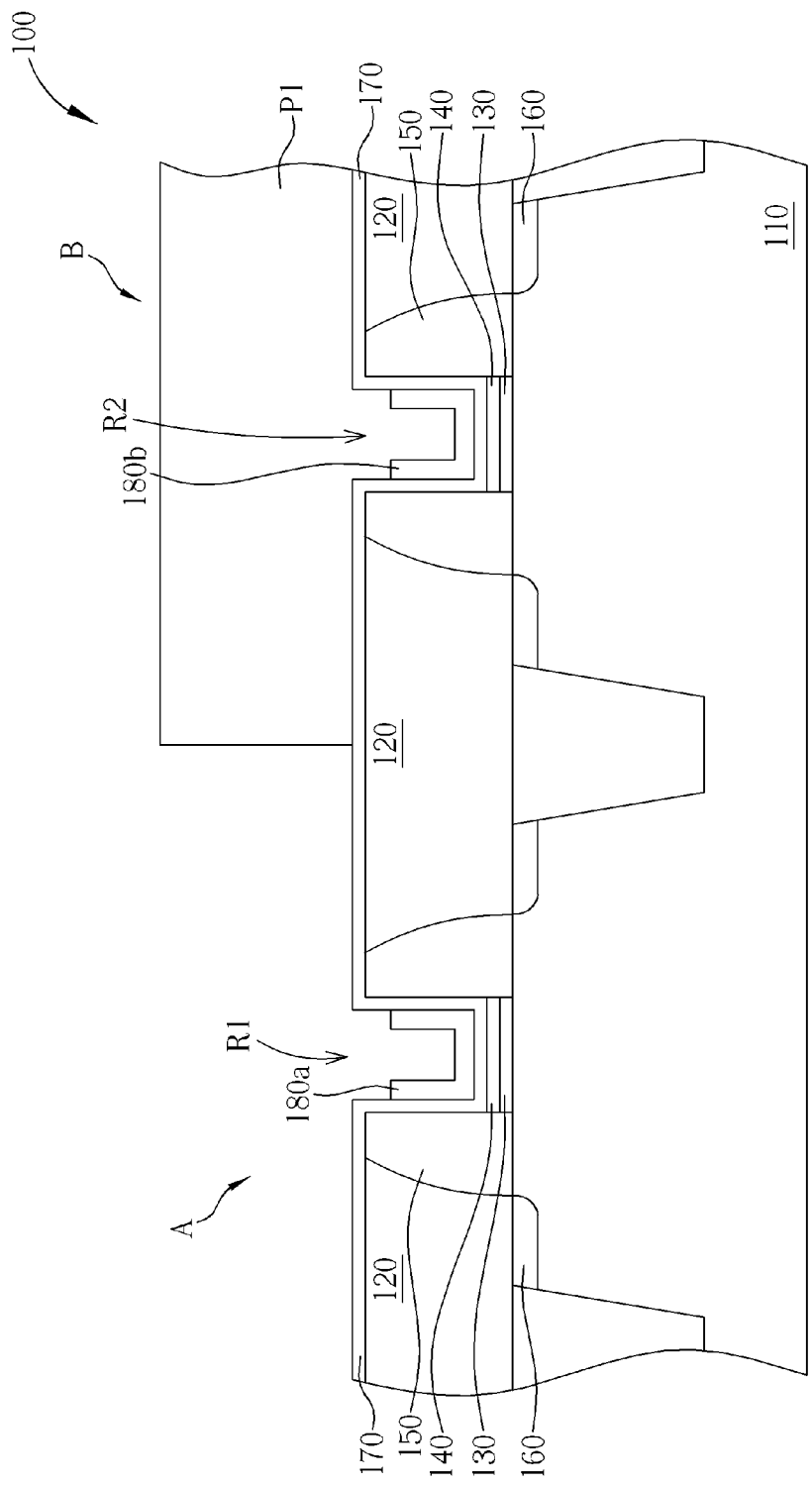
Figure 5:
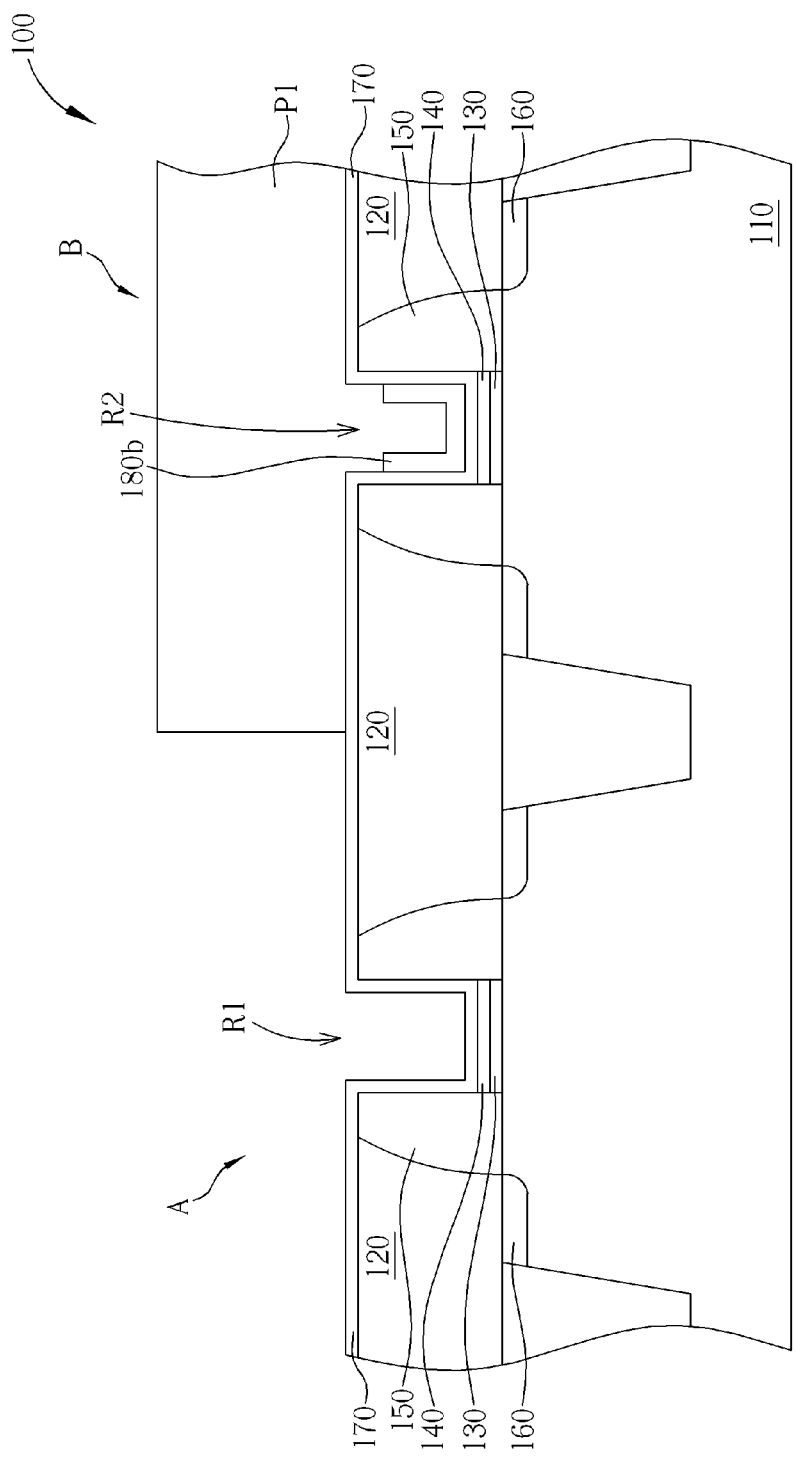
Figure 6:
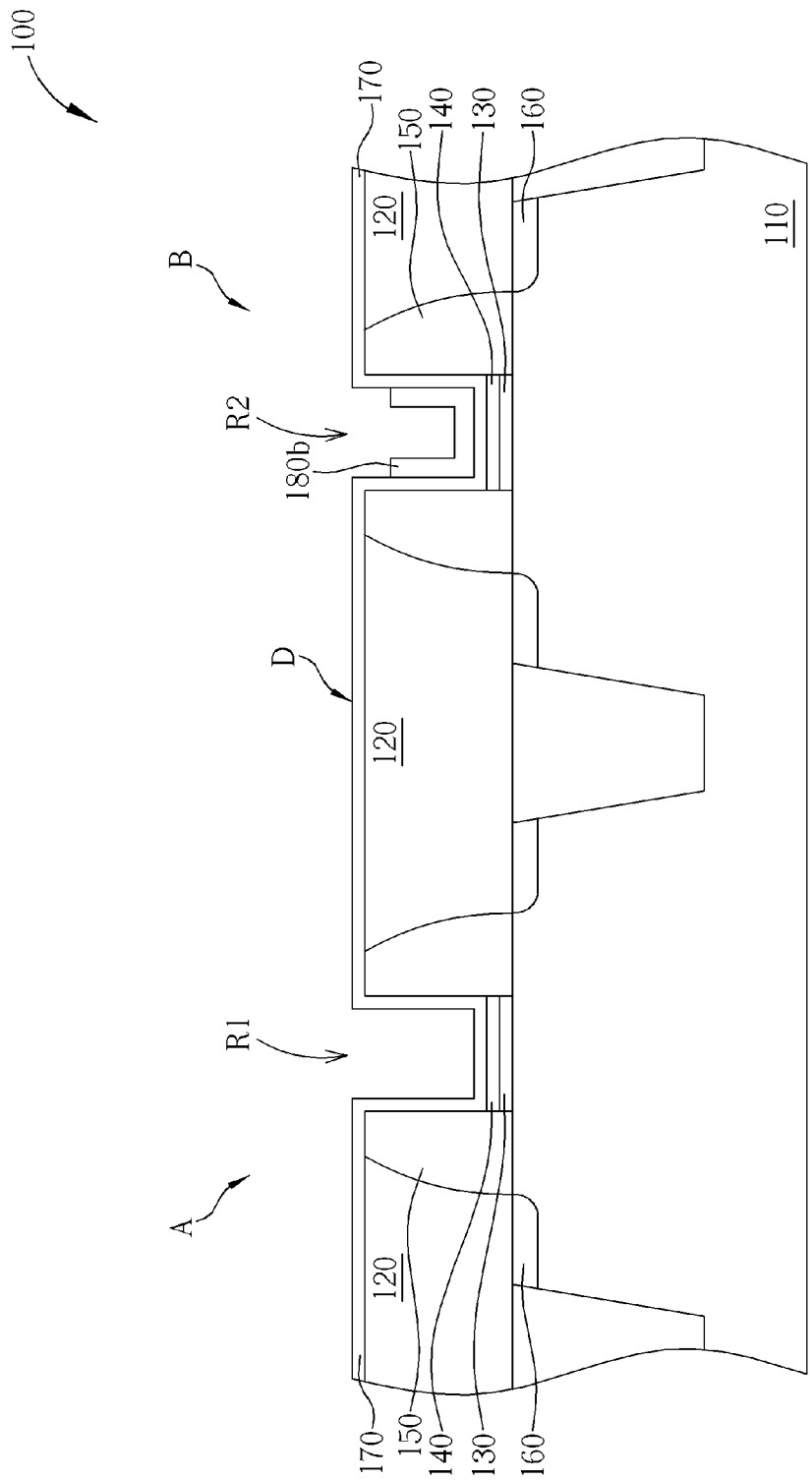

As shown in FIGS. 4-6, an etching process is selectively performed to remove the metal layer 180a in the first recess R1 and preserve the metal layer 180b in the second recess R2. For example, the etching process may be forming a patterned photoresist P1 to at least cover the second recess R2 and expose the first recess R1 as shown in FIG. 4. Then, as shown in FIG. 5, the metal layer 180a in the first recess R1 is removed. As shown in FIG. 6, the patterned photoresist P1 is removed. In this way, the metal layer 180b having a U-shaped profile structure is formed in the second recess R2 without leaving the metal layer 180a in the first recess R1. Thereafter, an N-type work function metal layer (not shown) may be formed in the first recess R1 and barrier layers (not shown) and a low resistance main conductive layer (not shown) may be formed in the first recess R1 and the second recess R2, respectively, concluding the metal gate process.

Only one iteration of the etching process is needed in this embodiment. In other words, the metal layer 180a in the first recess R1 is removed, while the metal layer 180b in the lower portion of the second recess R2 is preserved by using only one photomask in this embodiment. Thus, the present invention can simplify the complex process of the prior art. Due to the two lithography etching processes of the prior art not being needed in this embodiment, scoring caused by over-etching does not happen at the junction D of the two photomasks, which would lead to the material of the metal gate, such as aluminum, filling into the scoring while filling into the first recess R1 and the second recess R2. Therefore, short circuiting is avoided, since it is hard to remove the material of the metal gate in a chemical mechanical polishing (CMP) process once the material of the metal gate fills into the scoring. Height of the metal layer 180b remaining in the lower portion of the second recess R2 can be controlled by adjusting the height of the partially filled sacrificed material 190, thereby solving the problem of bad trench filling of depositing films. In one case, the vertical height of the sidewall of the metal layer 180b can be 5%~95% of the depth of the second recess R2.

In addition, a semiconductor process in the following can also be performed to achieve the purpose of the present invention. FIGS. 7-10 schematically depict a cross-sectional view of a semiconductor process according to the second preferred embodiment of the present invention.

As shown in FIG. 1, a substrate 110 is first provided. A flat interdielectric layer 120 is formed on the substrate 110 by performing a gate-last process, and the interdielectric layer 120 has a first recess R1 and a second recess R2. Details of the gate-last process are described in the first embodiment, and not described again here. The second embodiment may also be applied to a gate-last for high-k first process or a gate-last for high-k last process.

Figure 7:
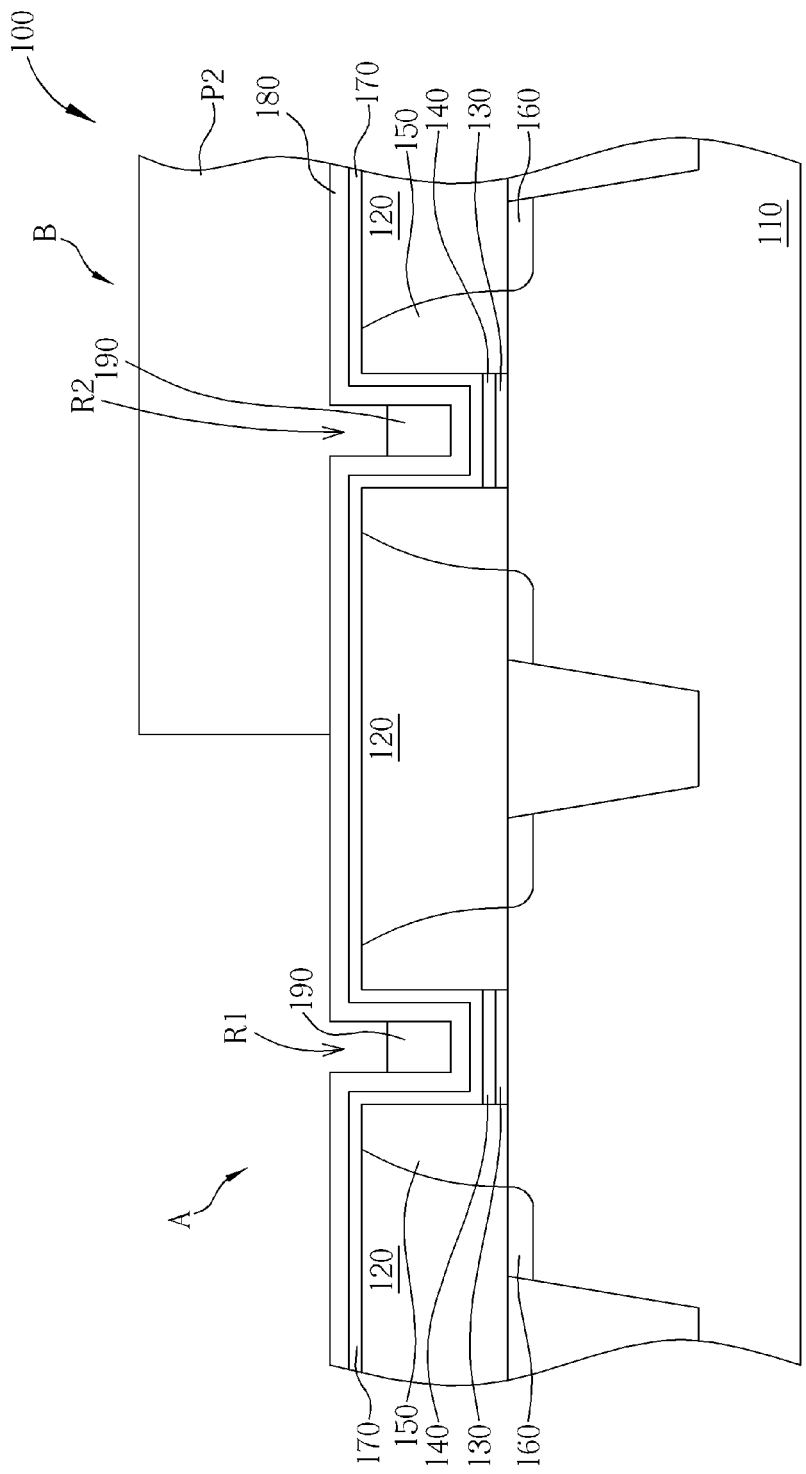
FIGS. 7-10 schematically depict a cross-sectional view of a semiconductor process according to the second preferred embodiment of the present invention.
Figure 8:
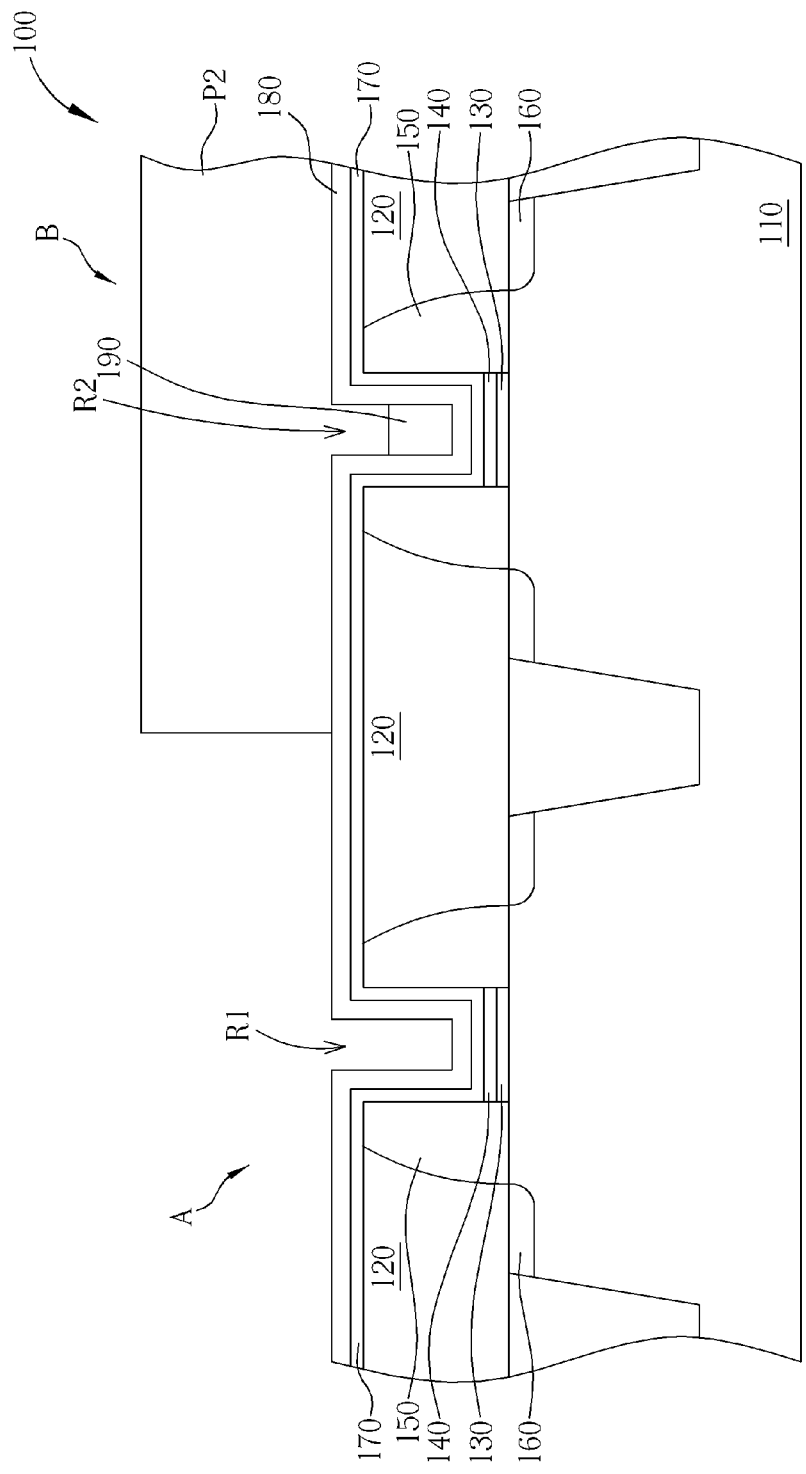
Figure 9:
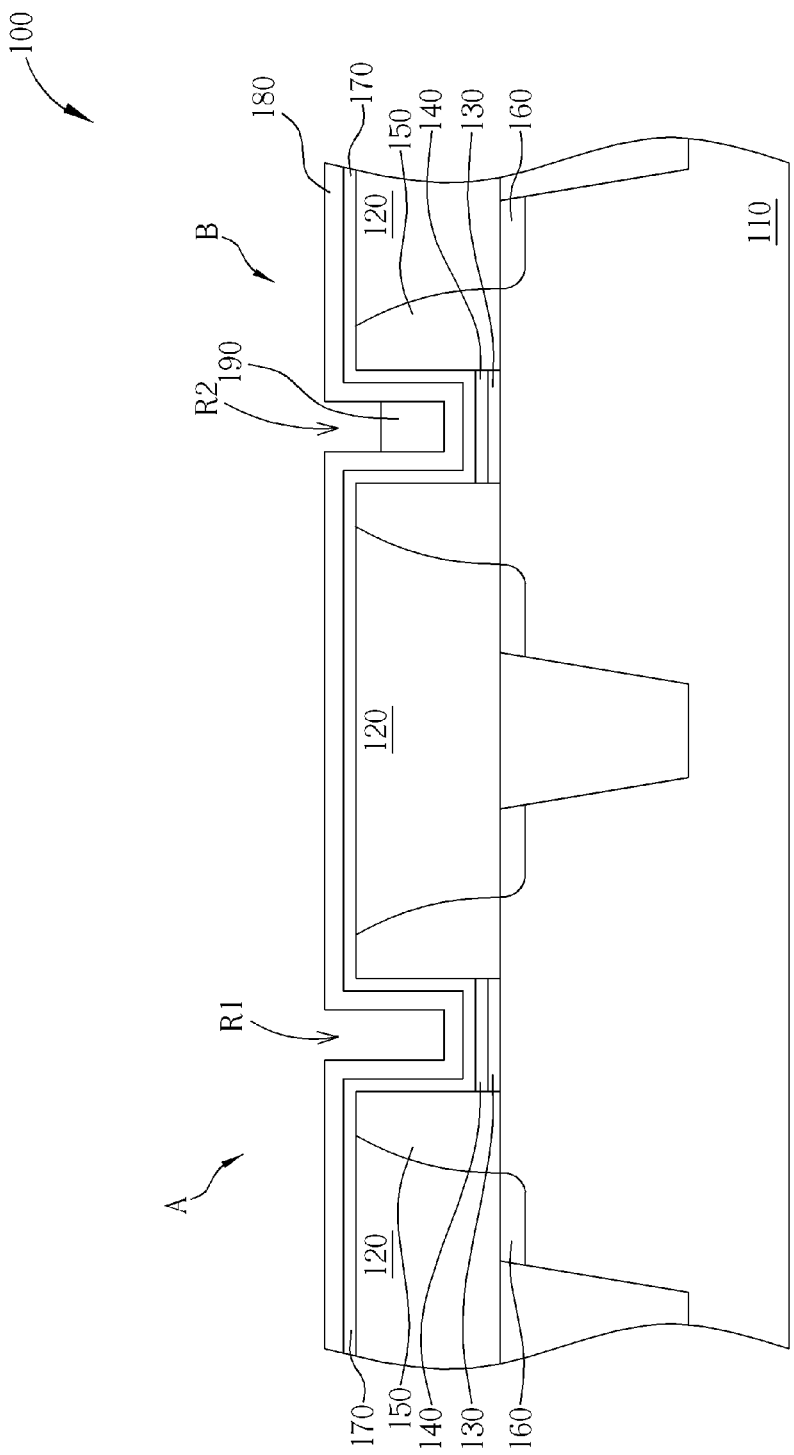

As shown in FIGS. 7-9, an etching process is selectively performed to remove the sacrificed material 190 in the first recess R1. The steps of the etching process may include forming a patterned photoresist P2 at least covering the second recess R2 and exposing the first recess R1 as shown in FIG. 7. Then, as shown in FIG. 8, the sacrificed material 190 in the first recess R1 is removed. As shown in FIG. 9, the patterned photoresist P2 is removed.

Figure 10:
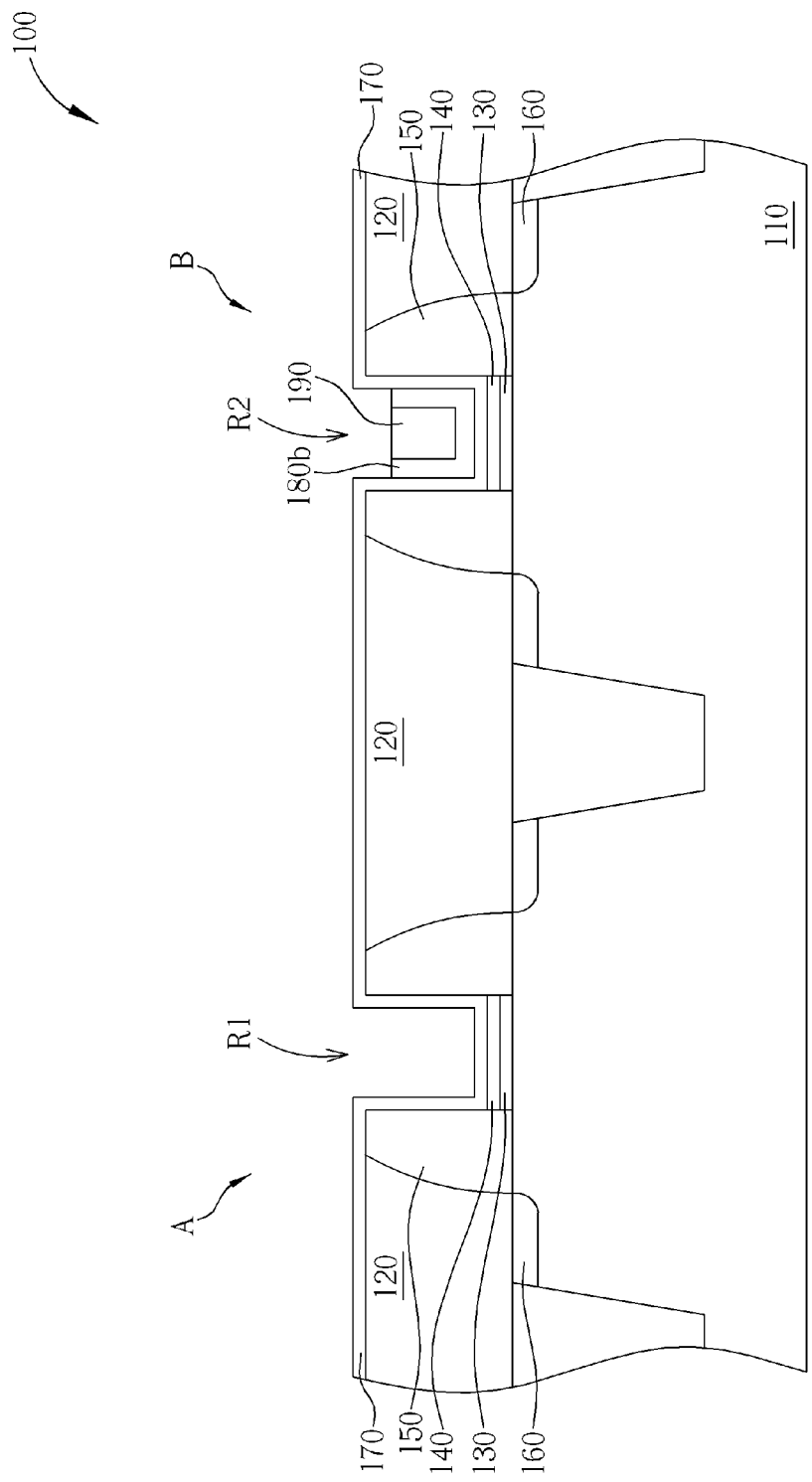

As shown in FIG. 10, an etching back process is performed to remove the uncovered metal layer 180 on the interdielectric layer 120 and in the first recess R1 and the second recess R2. The sacrificed material 190 remaining in the second recess R2 is removed while the metal layer 180b remaining in the lower portion of the second recess R2 is preserved. Finally, an N-type work function metal layer (not shown) may be formed in the first recess R1 and barrier layers (not shown), and a low resistance main conductive layer (not shown) may be formed in the first recess R1 and the second recess R2, respectively, completing the metal gate process. The semiconductor process of the second embodiment achieves the capability of the semiconductor process of the first embodiment, and likewise the common structure of the first embodiment as shown in FIG. 6.

The first embodiment and the second embodiment are both applied to fabrication of a CMOS transistor as an example, and the metal layer 180a in the first recess R1 of the NMOS transistor is entirely removed, while the metal layer 180b in the second recess R2 of the PMOS transistor is partially preserved. The processing steps may also be performed in a different order. The present invention can also be applied to fabrication of other semiconductor components by removing a portion of layers in recesses and preserving different amounts of layers in two recesses depending upon the processing requirements.

The present invention provides a semiconductor process that entirely removes a metal layer in a recess while preserving a metal layer in the other recess by performing a photolithography process once, namely by using only one photomask. Therefore, the present invention simplifies the complicated process of the prior art. Also, due to the present invention not using two photomasks, the scoring caused by over-etching does not occur at the junction of the two photomasks, which would lead to the material of the metal gate (such as aluminum) filling into the scoring while filling into recesses, thereby avoiding short circuit. Furthermore, the present invention controls the height of the metal layer remaining in a recess by adjusting the height of the sacrificed material filled into the recess, thereby solving the problem of difficulty in trench filling of depositing films.

Those skilled in the art will readily observe that numerous modifications and alterations of the device and method may be made while retaining the teachings of the invention.

What is claimed is:

1. A semiconductor process, comprising:
forming an interdielectric layer on a substrate, the interdielectric layer having a first recess and a second recess;
forming a metal layer covering the surface of the interdielectric layer, the first recess and the second recess;
partially filling a sacrificed material in the first recess and the second recess to respectively cover a portion of the metal layer in each of the recesses;
removing the uncovered metal layer in each of the recesses;
removing the sacrificed material; and
performing an etching process to remove the remaining metal layer in the first recess and preserve the remaining metal layer in the second recess.

2. The semiconductor process according to claim 1, wherein the first recess and the second recess further comprises:
a gate dielectric layer disposed on the substrate; and
a barrier layer disposed on the gate dielectric layer.

3. The semiconductor process according to claim 2, wherein the gate dielectric layer has a "-"-shaped profile structure.

4. The semiconductor process according to claim 2, wherein the gate dielectric layer has a U-shaped profile structure.

5. The semiconductor process according to claim 1, wherein the metal layer comprises a work function metal layer.

6. The semiconductor process according to claim 5, wherein the work function metal layer comprises a titanium nitride metal layer or an aluminum titanium metal layer.

7. The semiconductor process according to claim 1, wherein the sacrificed material comprises a non-sensitive material.

8. The semiconductor process according to claim 1, wherein the sacrificed material comprises photoresist material, dielectric anti-reflection coating (DARC), light absorbing oxide (DUO), bottom anti-reflective coating (BARC), sacrificial light absorbing material (SLAM) or spin-on glass (SOG).

9. The semiconductor process according to claim 1, wherein the steps of partially filling the sacrificed material in the first recess and the second recess to respectively cover the portion of the metal layer in each of the recesses, comprises:
forming the sacrificed material on the interdielectric layer and filling the sacrificed material into the first recess and the second recess; and
removing a portion of the sacrificed material on the interdielectric layer and in the recesses.

10. The semiconductor process according to claim 9, wherein removing the portion of the sacrificed material comprises performing a dry etching process, performing a wet etching process or performing a plasma bombardment process.

11. The semiconductor process according to claim 1, wherein the remaining metal layer in the second recess has a U-shaped profile structure and the height of the sidewall of the U-shaped profile structure is 5%~95% of the depth of the recess.

12. The semiconductor process according to claim 1, wherein the steps of the etching process comprise:
forming a patterned photoresist to at least cover the second recess and expose the first recess;
removing the remaining metal layer in the first recess; and
removing the patterned photoresist.

13. A semiconductor process, comprising:
forming an interdielectric layer on a substrate, the interdielectric layer having a first recess and a second recess;
forming a metal layer covering the surface of the interdielectric layer, the first recess and the second recess;
partially filling a sacrificed material in the first recess and the second recess to respectively cover a portion of the metal layer in each of the recesses;
performing an etching process to remove the sacrificed material in the first recess;
removing the uncovered metal layer in the first recess, the second recess and on the interdielectric layer; and removing the remaining sacrificed material in the second recess while preserving the remaining metal layer in the second recess.

14. The semiconductor process according to claim 13, wherein the first recess and the second recess further comprise:
    a gate dielectric layer disposed on the substrate; and
    a barrier layer disposed on the gate dielectric layer.

15. The semiconductor process according to claim 13, wherein the metal layer comprises a work function metal layer.

16. The semiconductor process according to claim 13, wherein the sacrificed material comprises photoresist material, dielectric anti-reflection coating (DARC), light absorbing oxide (DUO), bottom anti-reflective coating (BARC), sacrificial light absorbing material (SLAM) or spin-on glass (SOG).

17. The semiconductor process according to claim 13, wherein the steps of partially filling the sacrificed material in the first recess and the second recess to respectively cover the portion of the metal layer in each of the recesses, comprises:
    forming the sacrificed material on the interdielectric layer and filling the sacrificed material into the first recess and the second recess; and
    removing a portion of the sacrificed material on the interdielectric layer and in the recesses.

18. The semiconductor process according to claim 17, wherein removing the portion of the sacrificed material comprises performing a dry etching process, performing a wet etching process, or performing a plasma bombardment process.

19. The semiconductor process according to claim 13, wherein the remaining metal layer in the second recess has a U-shaped profile structure, and the height of the sidewall of the U-shaped profile structure is 5%~95% of the depth of the recess.

20. The semiconductor process according to claim 13, wherein the steps of the etching process comprise:
    forming a patterned photoresist to at least cover the second recess and expose the first recess;
    removing the remaining sacrificed material in the first recess; and
    removing the patterned photoresist.

* * * * *